(12) United States Patent
Chonnad et al.

(10) Patent No.: US 6,601,024 B1
(45) Date of Patent: Jul. 29, 2003

(54) CODE TRANSLATION BETWEEN HARDWARE DESIGN LANGUAGES

(75) Inventors: Shivakumar Shankar Chonnad, Sunnyvale, CA (US); Thomas Warren Savage, San Jose, CA (US); Manickam E. Kandaswamy, Sunnyvale, CA (US); Maulin Bhatt, San Jose, CA (US); Christopher A. Kopetzky, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/191,153

(22) Filed: Nov. 12, 1998

(51) Int. Cl.⁷ .............................................. G06F 17/50
(52) U.S. Cl. ............................................ 703/14; 716/3
(58) Field of Search .......................... 703/27, 14; 716/3

(56) References Cited

U.S. PATENT DOCUMENTS

| | | | |
|---|---|---|---|
| 5,475,624 A | * 12/1995 | West | 703/15 |
| 5,487,018 A | 1/1996 | Loos et al. | 364/489 |
| 5,491,640 A | 2/1996 | Sharma et al. | 364/488 |
| 5,493,507 A | 2/1996 | Shinde et al. | 364/489 |
| 5,493,672 A | * 2/1996 | Lau et al. | 703/21 |
| 5,535,386 A | 7/1996 | Wang | 395/600 |
| 5,541,849 A | 7/1996 | Rostoker et al. | 364/489 |
| 5,548,539 A | 8/1996 | Vlach et al. | 364/578 |
| 5,553,002 A | 9/1996 | Dangelo et al. | 364/489 |
| 5,572,436 A | 11/1996 | Dangelo et al. | 364/489 |
| 5,613,098 A | 3/1997 | Landau et al. | 395/500 |
| 5,623,418 A | 4/1997 | Rostoker et al. | 364/489 |
| 5,758,123 A | * 5/1998 | Sano et al. | 703/22 |
| 5,801,958 A | * 9/1998 | Dangelo et al. | 716/18 |
| 5,831,868 A | * 11/1998 | Beausang et al. | 716/18 |
| 5,870,585 A | * 2/1999 | Stapleton | 703/15 |
| 6,053,947 A | * 4/2000 | Parson | 703/14 |
| 6,226,780 B1 | * 5/2001 | Bahra et al. | 716/18 |
| 6,269,455 B1 | * 7/2001 | Deas | 714/29 |

OTHER PUBLICATIONS

Sanjay Sawant and Paul Giordano, RTL emulation: the next leap in system verification, 1996, Annual ACM IEEE Design Automation Conference, Proceedings, Las Vegas, Nevada, United States.*
HDL Chip Design, A Practical Guide for Designing, Synthesizing and Simulating ASICs and FPGAs using VHDdL or Verilog, by Douglas J. Smith, Doone Publications, ISBN 0–9651934–3–8, Jul. 2001, pp. 1–25.*

* cited by examiner

Primary Examiner—Hugh Jones
Assistant Examiner—Eduardo Garcia-Otero
(74) Attorney, Agent, or Firm—Bever, Hoffman & Harms, LLP

(57) ABSTRACT

An HDL-based ASIC design is translated from a first RTL description to a second RTL description. The first RTL description describes the HDL-based ASIC design through a first set of modules arranged in a hierarchical manner. Translation includes: creating a reference gate-level netlist by synthesizing the HDL-based ASIC design described using the first RTL description; creating a second set of modules by translating the first RTL description of the first set of modules to the second RTL description module by module; and creating a combined RTL and gate-level design by integrating at least one module from the second set of modules within the reference gate-level netlist. Each module translated into the second RTL description may be also checked for compilation warning or error messages. If any warning or error messages are generated, the offending module(s) is modified to eliminate the warning or error messages. In addition, each module described using the first RTL description may be functionally compared with each module described using second RTL description. If any functional discrepancy exists between corresponding first and second RTL modules, the offending module described using the second RTL description is modified to rectify the functional discrepancy. Top-level simulation may be also performed on all of the modules that are described using the second RTL description.

14 Claims, 14 Drawing Sheets

CODE TRANSLATION BETWEEN HARDWARE DESIGN LANGUAGES

BACKGROUND OF THE INVENTION

1. Field of the Invention

The present invention relates to hardware design languages. More particularly, the present invention relates to an improved method for translating between Verilog and VHDL hardware design languages.

2. The Background

One well-known method for designing an ASIC or an FPGA-based digital circuit includes using an HDL (Hardware Description language). An HDL is a notation for describing an electronic circuit at a specified level of abstraction. Three types of abstraction levels are defined for an HDL: RTL (register-transfer level), gate-level, and transistor level. RTL abstraction describes the functional or behavioral characteristics of a circuit. Gate level abstraction describes a circuit using gate logic elements, such as OR, NOR, AND, NAND, and the like, and their interconnections, which form a netlist reflecting the circuit design when coupled together. The transistor level, sometimes referred to as a switch level, describes the circuit design usage transistors and their interconnections as the basic elements defining the properties of the circuit.

Specifying the level of abstraction enables a designer to model a circuit design at an abstraction level suitable for a particular design step. For example, if a top-down design process is used to implement a design specification, the designer may define a circuit design starting at a behavioral or functional level. This enables the designer to isolate the functional aspects of the proposed circuit design from testing and implementation (gate-level and/or target technology) issues that otherwise would have been complicating factors.

To minimize confusion in the following discussion, an HDL-based circuit design modeled at one of the above levels of abstraction will be referred to according to the level of abstraction used. For example, an HDL-based circuit design at the register-transfer level will simply be referred to as an RTL-based circuit design. Similarly, a structural circuit design at the gate level or at the transistor level will be referred to as a gate level-based circuit design or a transistor level-based circuit design, respectively.

Two types of hardware description languages are currently in wide use in the digital circuit design or EDA (Electronic Design Automation) industry: VHDL and Verilog HDL (hereinafter referred to as Verilog). VHDL is an abbreviation for VHSIC (very high-speed integrated circuit) Hardware Description Language. Both hardware description languages, however, are not compatible or interchangeable with respect to their respective tools, such as verification and simulation tools. This incompatibility, among other things, has promoted a divergence among design companies and companies that provide re-useable IP (Intellectual Property) core design modules into VHDL, and Verilog "camps."

For example, a design company that is experienced in Verilog will typically look to Verilog-based re-useable modules as a source for design components, while a design company experienced in VHDL will typically look to VHDL-based re-useable modules. For a design company to switch to an HDL other than the one it is experienced with or to mix and match between the two types of HDLs would be too costly and/or inefficient. Re-useable Soft Intellectual Property (IP) Core vendors are also affected by the incompatibility between the HDLs because if they do not offer modules based on both types of HDLs, they risk losing market share to competitors that do.

One conventional solution to the above problems includes creating in a top-down manner an HDL-based circuit design at the register-transfer level (the "initial RTL-based circuit design") and then translating the initial RTL-based circuit design to a target RTL-based circuit design. This approach includes at least three steps.

First, as shown in FIG. 1, a test bench 10 is created for the initial RTL-based design 12 so that a set of reference output vectors 18 may be obtained. Test bench 10 includes: a top-level module 14 representing a set of modules which comprise initial RTL-based design 12, and a set of input test vectors 16. Top-level module 14 is simulated using input test vectors 16, generating a set of reference output vectors 18, sometimes referred to as golden output vectors.

Second, as shown in FIG. 2, initial RTL-based circuit design 12 is translated into a target RTL-based circuit design 20 having a top-level module 38 using a code translation tool 21. For example, if initial RTL-based circuit design 12 is described using VHDL, then the target RTL-based circuit design 20 is described using Verilog, or vice versa. The translation from one HDL type to another HDL type is performed on a module by module basis at the register-transfer level by a code translator. For example, the module tar1.mod 22 is created by translating the module org1.mod 24 from its initial RTL-based circuit design to the target RTL-based circuit design. Similarly, modules tar2.mod 26, tar3.mod 28, and tar4.mod 30 are created by translating the modules org2.mod 32, org3.mod 34, and org4.mod 36, respectively, from their initial RTL-based circuit design to target RTL-based circuit design. After translation, target RTL-based circuit design 20 is typically checked for any coding violations.

Finally, as shown in FIG. 3, the translated files tar1.mod 22, tar2.mod 26, tar3.mod 28, and tar4.mod 30 are integrated into a top-level module 38 after all of the initial modules have been translated. A top-level module includes a set of modules (typically all of the modules) which form a particular circuit design and describe the logical flow or arrangement of the modules with respect to each other. Hence, a top-level module is a fully hierarchical description of a set of modules that form a particular circuit design.

After integration, top-level module 38 is simulated by running a test bench 40 using test input vectors 16, creating a set of test output vectors 42. Test output vectors 42 are then compared with reference output vectors 18 to determine the accuracy of the translation.

The above approach suffers from the following disadvantages. First, all of the initial modules must be translated before the target modules can be integrated and tested. This prolongs the translation process because the integration of the target modules into a top-level module for simulation and testing cannot begin until the last initial module has been translated. For example, if org1.mod, org2.mod, org3.mod, and org4.mod require 1 day, 3 days, 5 days, and 15 days, respectively, to translate into their corresponding target modules, then integration and testing cannot begin until the end of the 15th day.

Moreover, testing is performed on the RTL-based top-level module, i.e., all of the target modules are tested at once. This renders debugging difficult (and hence increases verification time) because any problems encountered cannot be easily limited to one target module. This scenario is more complex especially when the logic path traverses multiple levels of hierarchy.

Accordingly, a need exists for an improved method for translating an initial RTL-based circuit design to a target RTL-based circuit design, which has a reduced translation and integration period.

Further, a need exists for an improved method for translating from an initial RTL-based circuit design to a target RTL-based circuit design, which ensures exact functional equivalence between the initial RTL-based and target RTL-based circuit designs.

SUMMARY OF THE INVENTION

In a first aspect of the present invention, an HDL-based ASIC design is translated from a first RTL description to a second RTL description. The first RTL description describes the HDL-based ASIC design through a first set of modules arranged in a hierarchical manner. Translation includes: creating a reference gate-level netlist by synthesizing the HDL-based ASIC design described using the first RTL description; creating a second set of modules by translating the first RTL description of the first set of modules to the second RTL description module by module; and creating a combined RTL and gate-level design by integrating at least one module from the second set of modules within the reference gate-level netlist.

In a second aspect of the present invention, each module translated into the second RTL description is checked for compilation warning or error messages. If any warning or error messages are generated, each offending module is modified to eliminate the warning or error messages. In addition, each module that is described using the first RTL description may be functionally compared with each module that is described using second RTL description. If any functional discrepancy exits between corresponding first and second RTL modules, the offending module that is described using the second RTL description is modified to rectify the functional discrepancy.

In a third aspect of the present invention, a top-level simulation may also be performed on all of the modules that are described using the second RTL description.

DETAILED DESCRIPTION OF A PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
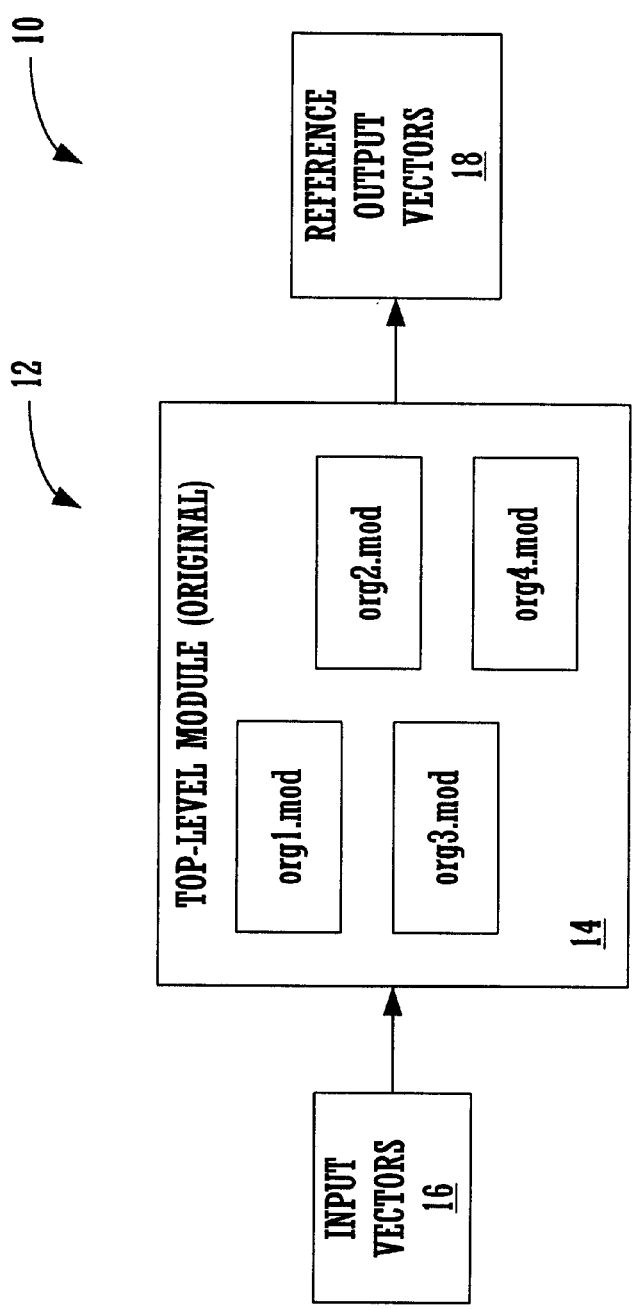
FIG. 1 is a block diagram showing a test bench configuration for top-level testing an initial RTL-based circuit design.
Figure 2:
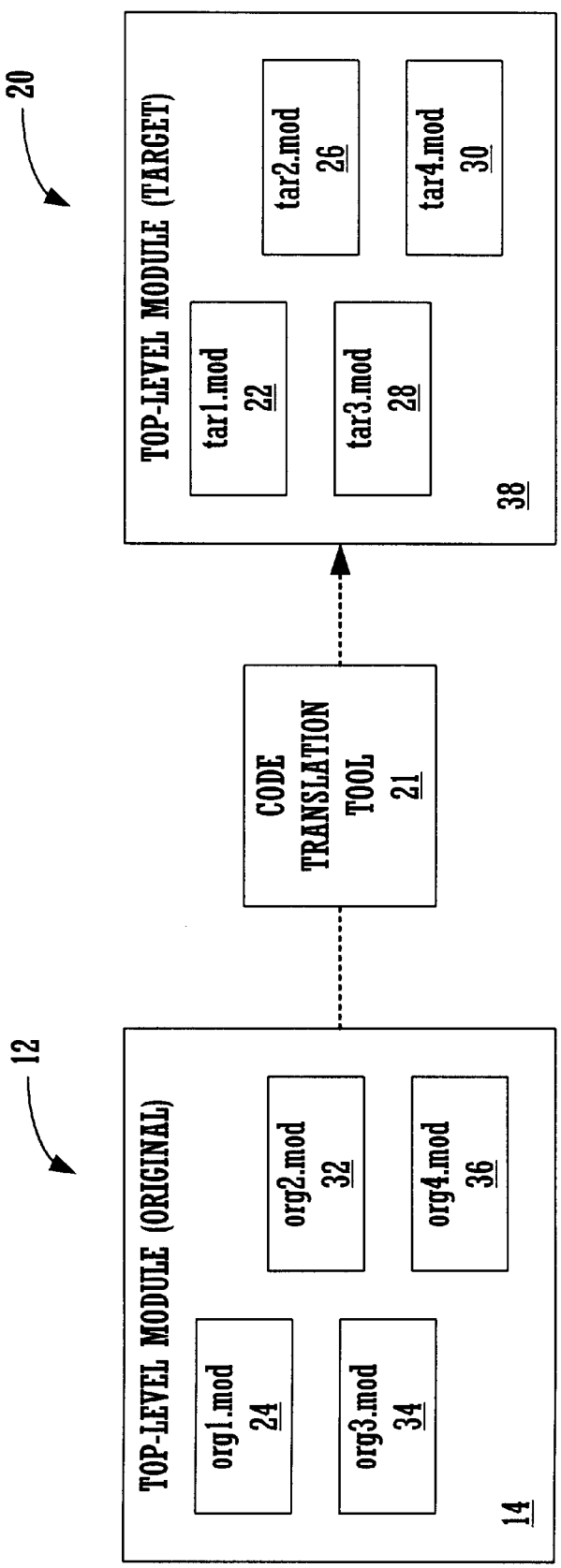
FIG. 2 is a block diagram showing a module by module translation of an initial RTL-based circuit design to a target RTL-based circuit design.
Figure 3:
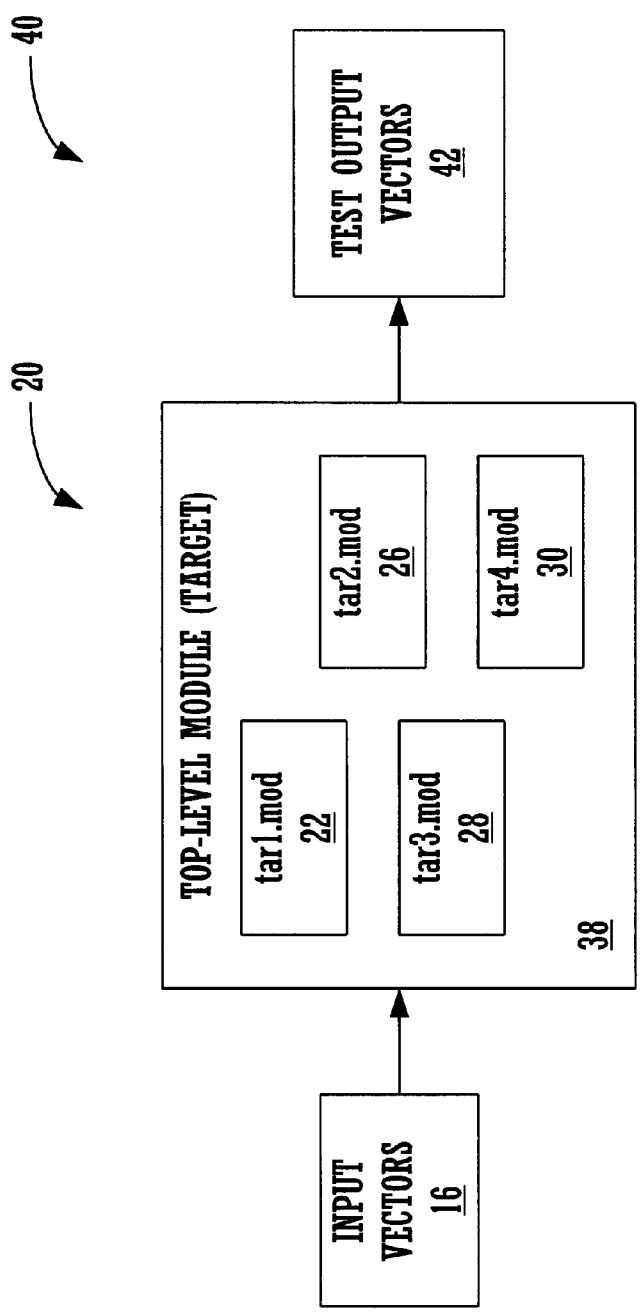
FIG. 3 is a block diagram showing a test bench configuration for top-level testing of a target RTL-based circuit design.
Figure 4:
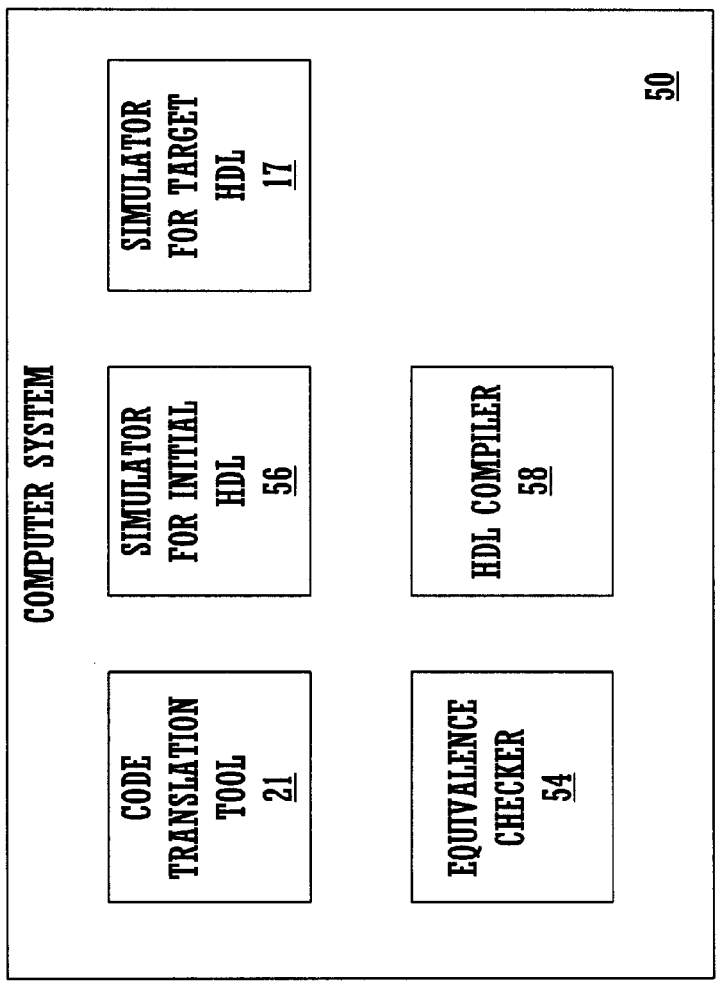
FIG. 4 is a block diagram showing a computer system for translating an initial RTL-based circuit design to a target RTL-based circuit design in accordance with a presently preferred embodiment of the present invention.

FIG. 4 is a block diagram of a computer system for translating an initial RTL-based circuit design to a target RTL-based circuit design in accordance with a presently preferred embodiment of the present invention.

Computer system 50 is shown having a code translation tool 21, herein referred to as a translator 21, an equivalence checker 54, simulators 56 and 17, and an HDL compiler 58. Translator 21 is any tool that can translate an HDL-based circuit design of a first type to an HDL-based circuit design of a second type. For example, translator 21 may be implemented using vhdltovl, which is a tool for translating a VHDL RTL-based circuit design into a Verilog RTL-based circuit design. If translation from Verilog to VHDL is desired, the code translation tool interVHDL may be used instead for code translation. The vhdltovl and interHDL translation tools are available from interHDL, Inc., of Los Altos, Calif.

Computer system 50 includes a SunSparc™ computer hardware platform running the Solaris operating system, both available from Sun Microsystems™ of Mountain View, Calif. This implementation is not intended in anyway to be limiting. Computer system 50 may include any computer hardware platform capable of running any operating system so long as the computer hardware platform and operating system chosen are capable of supporting the tools disclosed.

Equivalence checker 54 performs a logical comparison between the Verilog and VHDL versions of the circuit design, enabling it to determine whether the two designs are functionally equivalent. Simulator 56 is a simulation tool capable of simulating an initial HDL circuit design, such as a circuit design described using VHDL/RTL. Simulator 17 is a simulation tool capable of simulating a target HDL circuit design, such as a circuit design described using Verilog/RTL. HDL compiler 58 is an HDL-based circuit design at the register-transfer level (or equivalent behavioral level) to the gate level, creating a gate level netlist of the compiler circuit design. Equivalence checker 54, simulator 56, and HDL compiler 58 maybe implemented using the Formality, VSS, and Design Compiler tools, respectively, available from Synopsys Inc., of Mountain View, Calif. Simulator 17 may be implemented using tile VCS tool, also available from Synopsys Inc.

Those of ordinary skill in the art will readily recognize that simulators 56 and 17 provide computer system 50 with the capability to simulate two types of hardware description languages, such as VHDL and Verilog. However, the number of simulators is not intended to be limiting in any way as long as the simulators used are capable of simulating at least the initial HDL-based circuit design and the target HDL circuit design. For example, any simulator that is capable of simulating a circuit design in either of its initial and target forms may also be used.

Figure 5:
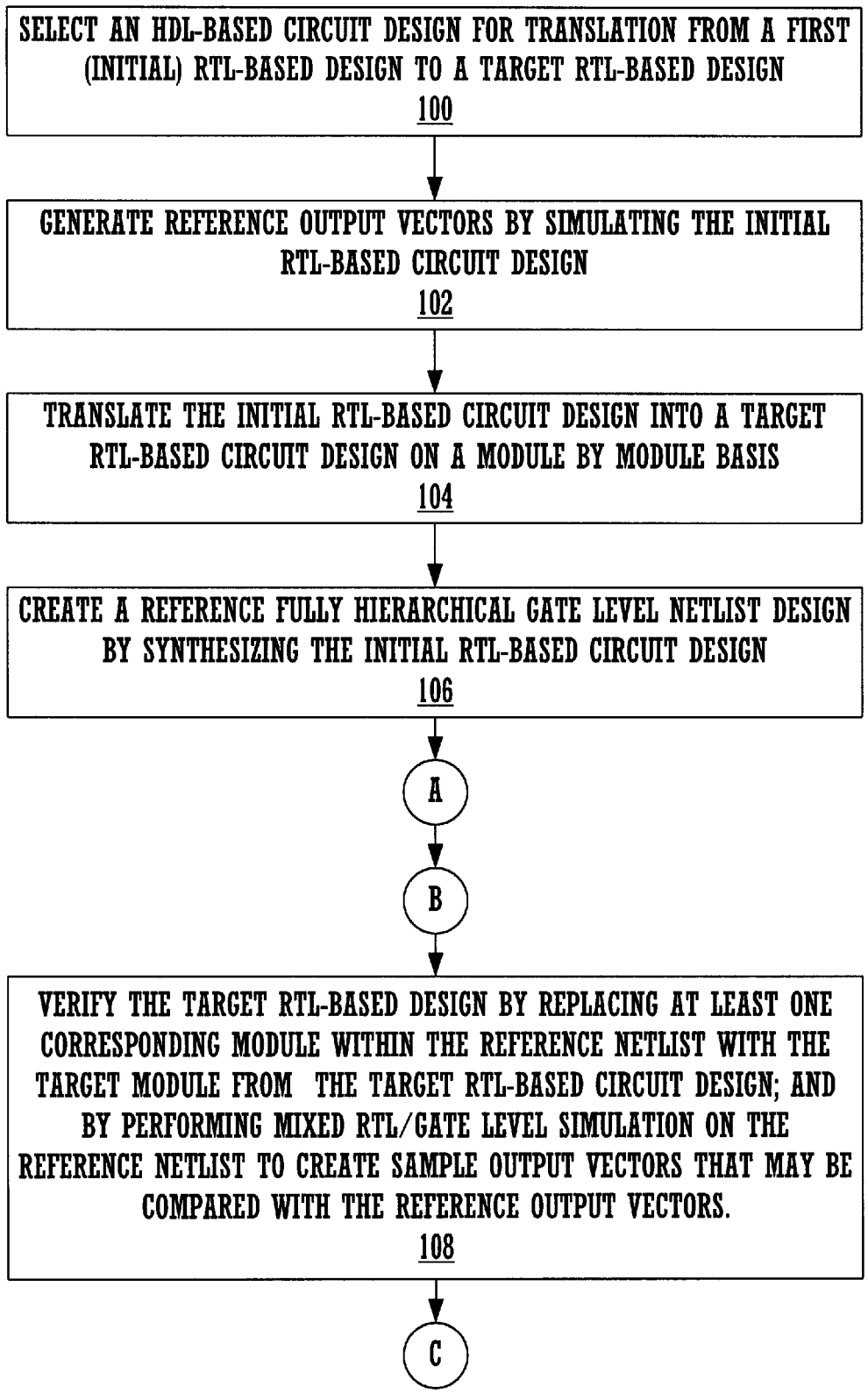
FIG. 5 is a process flow showing a method for translating an initial RTL-based circuit design to a target RTL-based circuit design in accordance with a presently preferred embodiment of the present invention.

FIG. 5 is a process flow showing a method for translating an initial RTL-based circuit design to a target RTL-based circuit design in accordance with a presently preferred embodiment of the present invention.

At reference number 100, a selected HDL-based circuit design is translated from a first (initial) RTL-based design to a target RTL-based design. The initial RTL-based circuit design includes a set of modules arranged in a hierarchical manner. In addition, the present invention is limited to HDL-based digital circuit designs directed toward ASIC or FPGA technology.

The number of modules used in the initial RTL-based circuit design is not intended to be in any way limiting. Any number of modules may be used without departing from the scope and spirit of the disclosure. The modules should be part of a hierarchy that describes the circuit design, enabling each module to be independently translated and tested. In accordance with a presently preferred embodiment of the present invention, the order of translation and testing is performed in a bottom up approach. For example, the modules at the lowermost level of hierarchy are translated and tested first. Once the lowermost level modules are translated and tested, the process is repeated for modules located at the next higher level within the hierarchy. This continues until all modules at all levels of the hierarchy are translated and tested.

Figure 6:
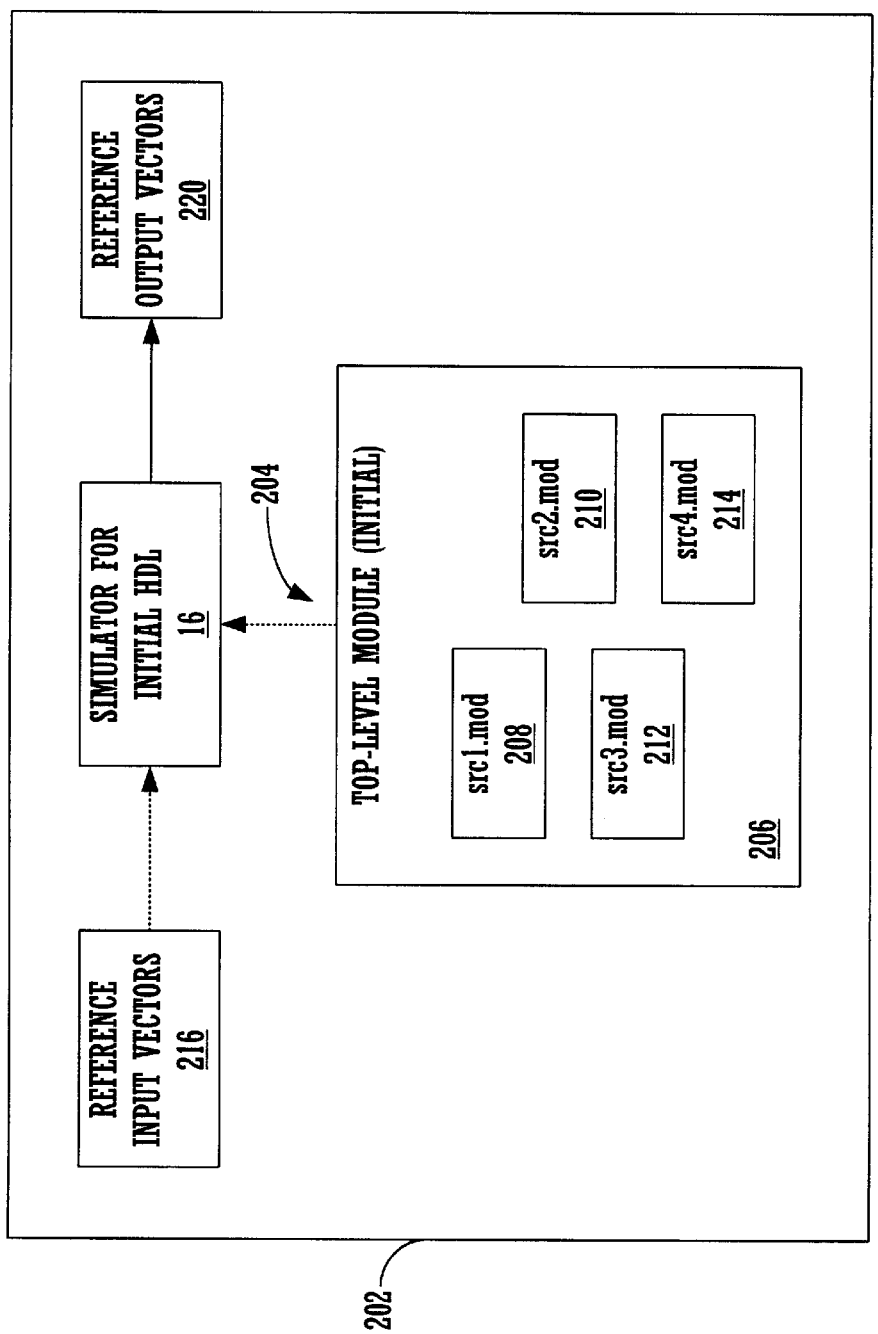
FIG. 6 is a block diagram showing a test bench used in the translation of an initial RTL-based circuit design to a target RTL-based circuit design in accordance with a presently preferred embodiment of the present invention.

FIG. 6 is a block diagram showing a test bench use in the translation of an initial RTL-based circuit design to a target RTL-based circuit design in accordance with a presently preferred embodiment of the present invention.

At reference number 102, reference output vectors generated by simulating the initial RTL-based circuit design. For example, as shown in FIG. 6, a test bench 202 may be created for a VHDL RTL-based circuit design, hereinafter referred to as initial RTL-based circuit design 204. Top-level module 206 is created by integrating modules that represent initial RTL-based circuit design 204, such a source modules: src1.mod 208, src2.mod 210, src3.mod 212 and src4.mod 214. Test bench 202 also includes reference-input vectors 216, which are used by a simulator, such as simulator 56, to generate reference output vectors 220 during simulation. Simulation of initial RTL-based design 204 occurs at the top-level, i.e., top-level module 206 is simulated rather than each module independently in a bottom-up approach.

Those of ordinary skill in the art will recognize that the test bench must be configured to read input vectors and write output vectors in a manner suitable for the type of HDL used to describe the circuit design slated for simulation. For example, because initial RTL-based circuit design 204 is annotated using VHDL, test bench 202 must be configured to read input vectors suitable for VHDL, such as vectors created using PCI bus functional models from Logic Modeling, division of Synopsys, Inc. Test bench 202 must also write output vectors in a format suitable for VHDL, such as output written using the standard TEXTIO package of VHDL. The output vectors generated during simulation by input vectors 216 are strobed (i.e., the output vectors are captured in 1's and 0's for each clock cycle), time-stamped with the simulation time, and saved into individual and unique output vector files to create reference output vectors 220.

Similarly, if initial RTL-based circuit design 204 is annotated using Verilog, then the test bench used will need to be configured to read input vectors and write output vectors 220 in a manner compatible with Verilog.

Figure 7:
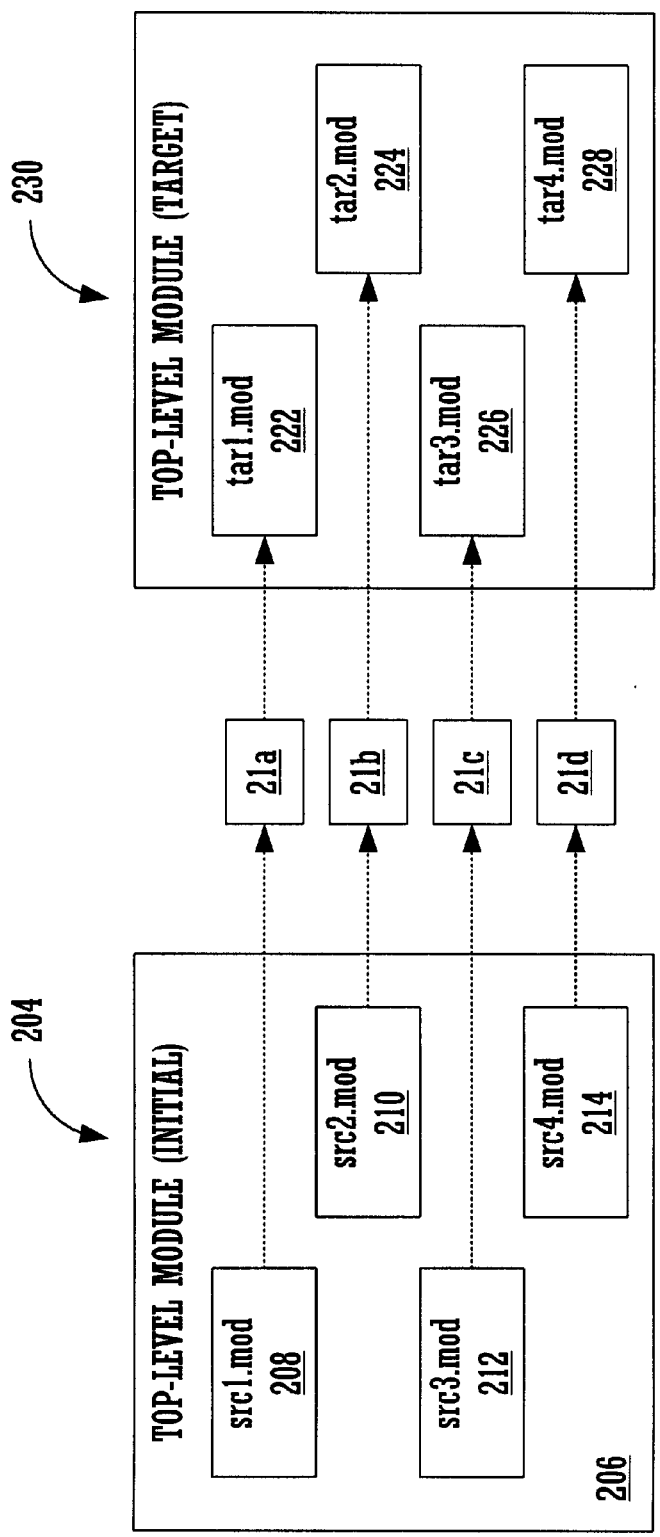
FIG. 7 is a block diagram showing the parallel use multiple instances of a code translation tool to translate an initial RTL-based circuit design to a target RTL-based circuit design in a module by module basis in accordance with a presently preferred embodiment of the present invention.

FIG. 7 is a block diagram showing the parallel use of multiple instances of a code translation tool 21a–21d to translate an initial RTL-based circuit design to a target RTL-based circuit design in a module by module basis in accordance with a presently preferred embodiment of the present invention.

Referring again to FIG. 5, at reference number 104 the initial RTL-based circuit design is translated into a target RTL-based circuit design on a module by module basis. For example, as shown in FIG. 7, src1.mod 208, src2.mod 210, src3.mod 212, and src4.mod 214, representing source RTL-based circuit design 204, are translated into corresponding modules: tar1.mod 222, tar2.mod 224, tar3.mod 226, tar4.mod 228, respectively. The corresponding modules represent a target RTL-based circuit design 230 using a second type of HDL, such as Verilog HDL.

At least two instances of a code translation tool may be used for translating each individual source module, enabling some of the source modules to complete the translation step before other more difficult/longer source modules are completed. Hence, each source module is translated in parallel with each other rendering source modules, which translate earlier, available for integration and testing as described below. For example, four instances of a code translation tool may be used to translate in parallel the four source modules shown in FIG. 7. A code translation tool 21a is for translating src1.mod 208, a code translation tool 21b is for translating src2.mod 208, a code translation tool 21c is for translating src3.mod 212, and a code translation tool 21d is for translating src4.mod 214.

Although the above example teaches using a separate code translation tool instance for each separate source module, any number of code translation tool instances may be used as long as at least two source modules are translated independently and in parallel with each other. By translating in parallel at least two source modules, the next step of integration and testing can begin as soon as one of the source modules completes translation. Moreover, this permits a bottom-up approach to testing each module, simplifying the debugging of the target RTL-based design as described below.

Those of ordinary skill in the art will readily recognize that concurrent translation may be further enhanced by providing a separate computer system, such as computer system 50, for each code translation tool instance used. This enables a multi-engineer design team approach that can further enhance concurrent code translation and the benefits arising from such an approach.

Translating from an initial VHDL/RTL-based circuit design to a target Verilog HDL/RTL-based circuit requires a VHDL to Verilog capable code translator, such as the vhdltovl code translation tool available from interHDL, Inc. of Los Altos, Calif. If translation from VHDL to Verilog is desired, then the interVHDL code translation tool, which is also available from interHDL, Inc. may be used.

Figure 8:
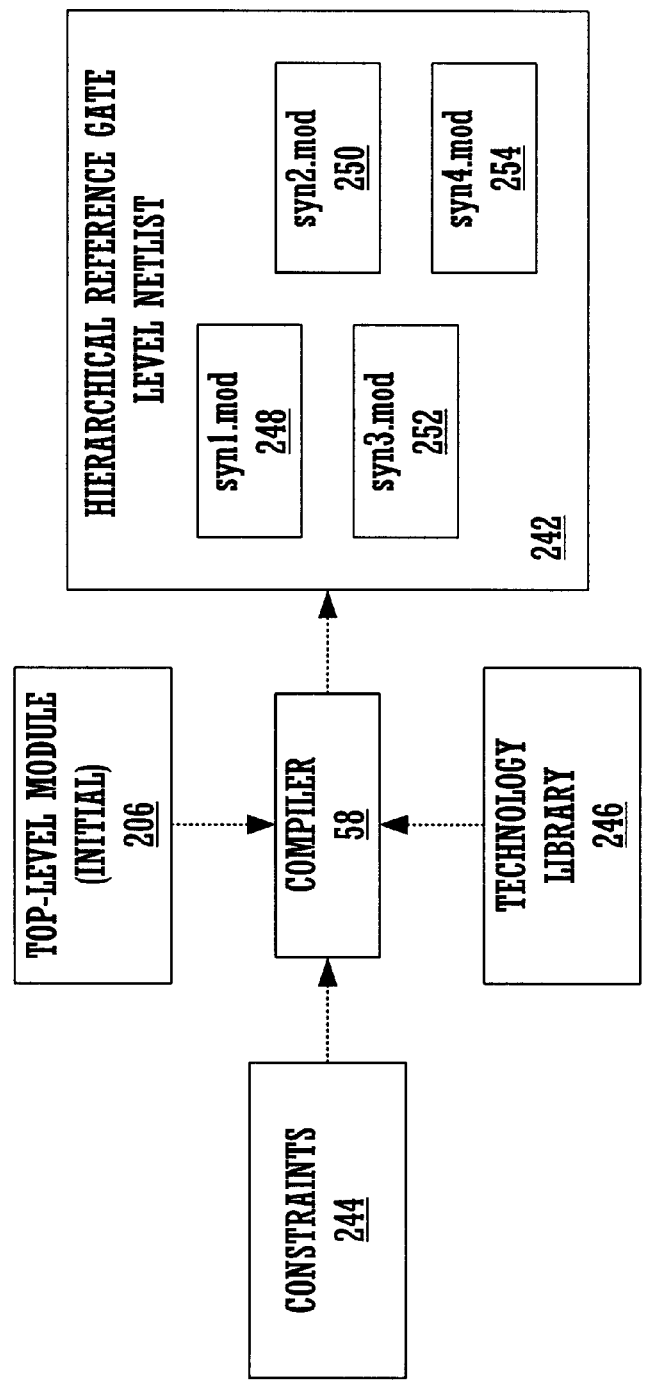
FIG. 8 is a block diagram showing the use of an RTL gate level compiler to hierarchical gate level netlist in accordance with a presently preferred embodiment of the present invention.

FIG. 8 is a block diagram showing the use of an RTL-gate level compiler to synthesize an original HDL RTL-based circuit design to a reference and fully hierarchical gate level netlist in accordance with a presently preferred embodiment of the present invention.

At reference number 106, a fully hierarchical gate level netlist design, which will be used as a reference netlist, is created by synthesizing the initial RTL-based circuit design. For example, as seen in FIG. 8, HDL compiler 58 maybe used to generate a reference and fully hierarchical gate level netlist 242 (hereinafter "reference netlist") from original top-level module 206 annotated at the register-transfer level. This includes synthesizing top level module 206, which corresponds to original RTL-based circuit design 204, and using constraints 244 required for top-level synthesis and a target technology library 246, such as an ASIC or a FPGA technology library during synthesis.

Synthesis may be performed using the compile command, or any equivalent command that will initiate synthesis for a particular synthesis tool, because only a functional check with unit delays is required. Full timing gate simulation is not required at this stage although this is not intended to be limiting. The target notation chosen for reference netlist 242 is the HDL corresponding it the target RTL-based circuit design. For example, if the target RTL-based circuit design is Verilog based, then reference netlist 242 is generated (commonly referred to as "written out") in Verilog. Similarly, if the HDL corresponding to the target RTL-based circuit design is VHDL, then reference netlist 242 is written out in VHDL.

The arrangement of reference netlist 242 is fully hierarchical with each sub-module defined according to their respective levels within the hierarchy. For example, as seen in FIG. 8, the generation of reference netlist 242 in a fully hierarchical arrange includes instantiations of sub-modules, such as syn1.mod 248, syn2.mod 250, syn3.mod 252, and syn4.mod 254.

Referring again to FIG. 5, at reference number 108, through nodes A and B, the target RTL-based design is verified by replacing at least one corresponding module within the reference netlist with the target module from the target RTL-based circuit design; and by performing mixed RTL/gate level simulation on the reference netlist to create output vectors that may be compared with the reference output vectors.

The output vectors are described using a logic format (i.e., 1's and 0's), enabling an HDL independent comparison between the output vector and the reference output vectors because both sets of vectors can be compared at the binary file level. For example, in a computer system using UNIX as its operating system, both the output vectors and reference output vectors may be compared at the file level using the "diff UNIX command, which compares the content of two files.

Figure 9A:
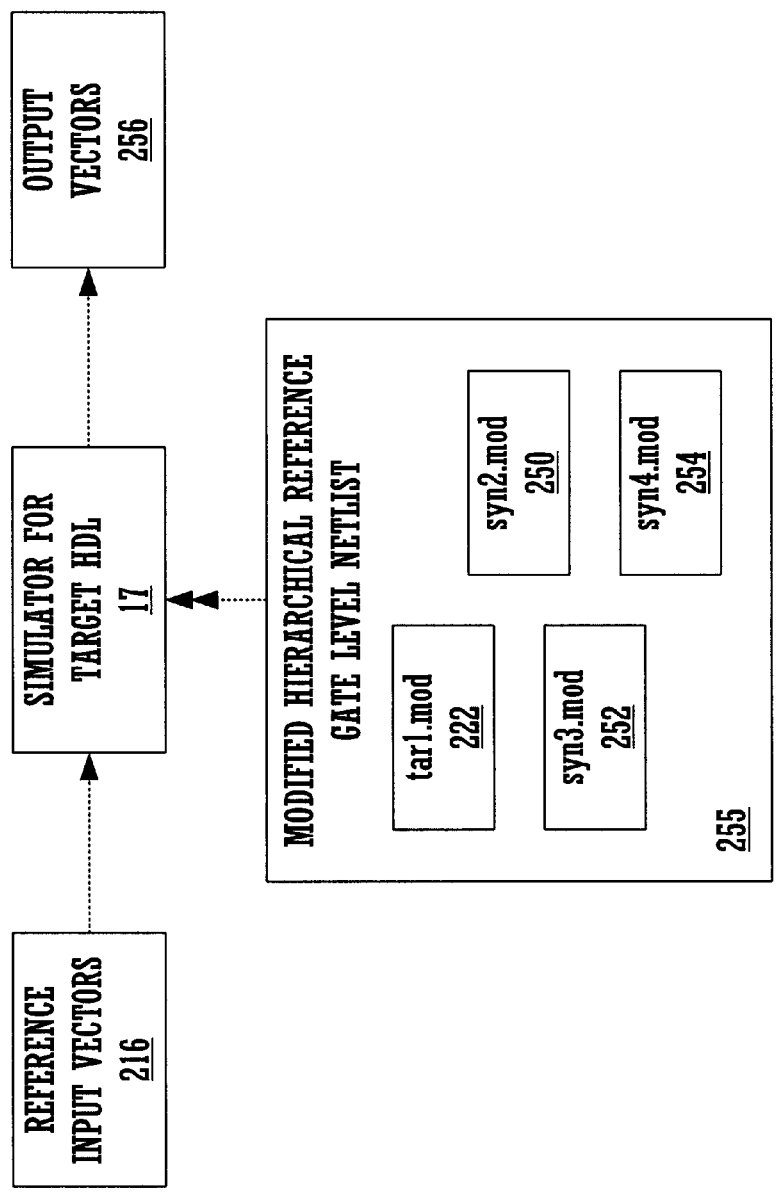
FIG. 9A is a block diagram showing a verification environment where a first synthesized module is replaced with a first target module in accordance with a presently preferred embodiment of the present invention.

FIG. 9A is a block diagram showing a verification environment where a first synthesized module is replaced with a first target module in accordance with a presently preferred embodiment of the present invention.

For example, referring to FIG. 9A, syn1.mod 248 in hierarchical reference gate-level netlist 242 (see FIG. 8) is replaced by a corresponding target RTL-based module, such as tar1.mod 222. Upon replacement, mixed RTL/gate level simulation is performed on modified hierarchical reference gate level netlist 255 using initial reference input vectors 216. This generates output vectors 256 that can then be compared with reference output vectors 220 to ensure that the translation of tar1.mod 222 is accurate. This continues for all of the remaining modules, within reference netlist 242 until all of the modules have been individually tested using mixed RTL/gate level simulation.

Figure 9B:
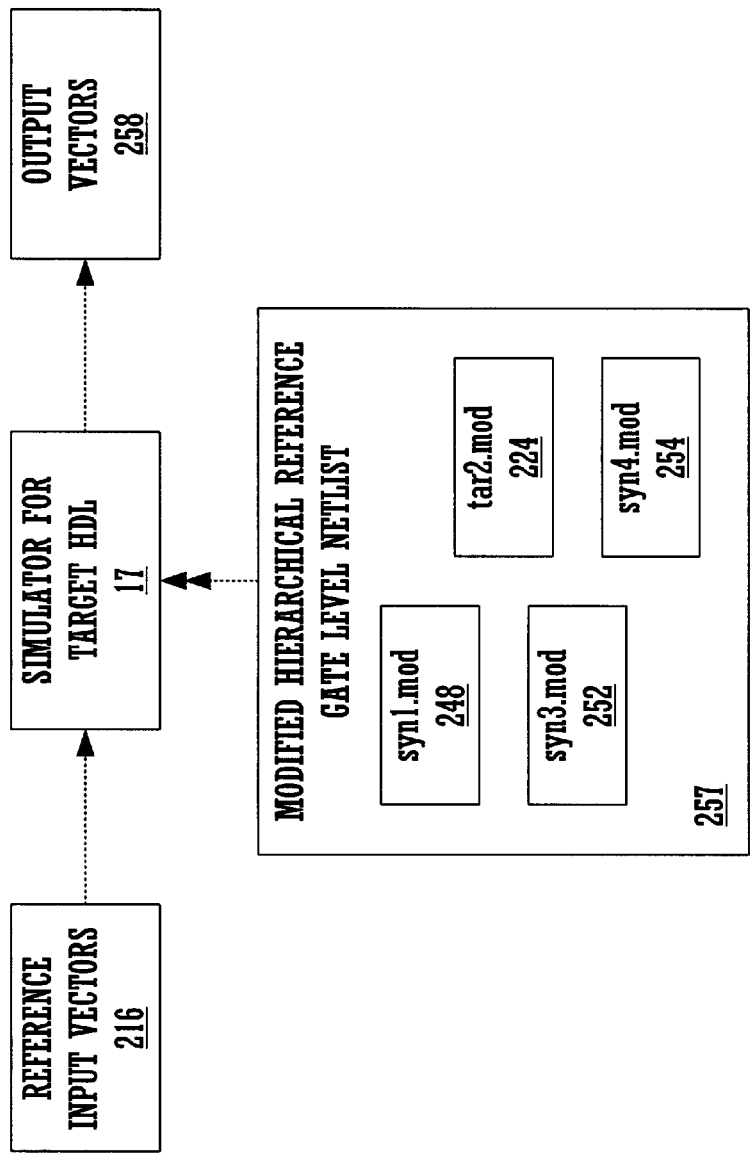
FIG. 9B is a block diagram showing a verification environment where a second synthesized module is replaced with a second target module in accordance with a presently preferred embodiment of the present invention.

FIG. 9B is a block diagram showing a verification environment where a second synthesized module is replaced with a second target module in accordance with a presently preferred embodiment of the present invention.

Similarly, referring to FIG. 9B, verifying tar2.mod 224 includes replacing syn2.mod 250 within reference netlist 242 (see FIG. 8), and keeping the other synthesized modules in place, such as syn1.mod 248, syn3.mod 252, and syn4.mod 254. Upon replacement, mixed RTL/gate level simulation is performed on modified hierarchical reference gate level netlist 257. This results in a verification environment where the synthesis modules remaining can be assumed to be functionally equivalent to their corresponding modules within original RTL-based design 204, while any discrepancies between output vectors 258 and reference output vectors 220 is attributable to the tar2.mod 224.

Figure 9C:
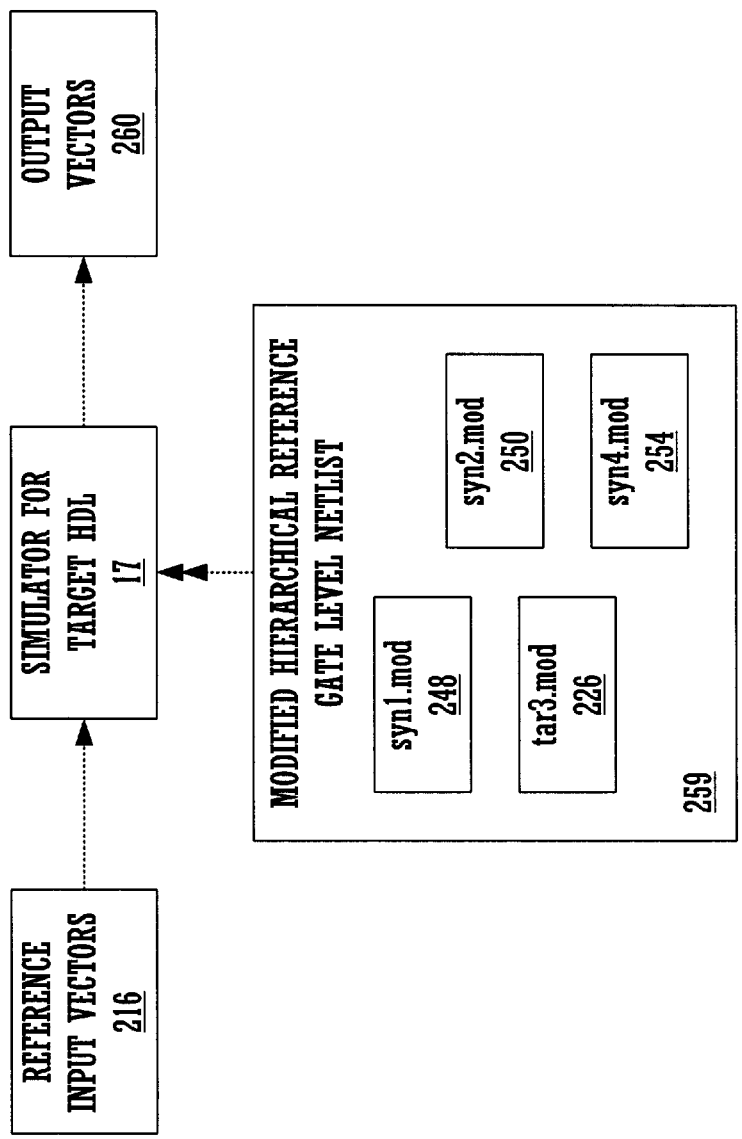
FIG. 9C is a block diagram showing a verification environment where a third synthesized module is replaced with a third target module in accordance with a presently preferred embodiment of the present invention.

FIG. 9C is a block diagram showing a verification environment where a third synthesized module is replaced with a third target module in accordance with a presently preferred embodiment of the present invention.

Similarly, referring to FIG. 9C, verifying tar3.mod 226 includes replacing syn3.mod 252 within reference netlist 242 (see FIG. 8), and keeping the other synthesized modules in place, such as syn1.mod 248, syn2.mod 250, and syn4.mod 254. Upon replacement, mixed RTL/gate level simulation is performed on modified hierarchical reference gate level netlist 259. This results in a verification environment where the synthesis modules remaining can be assumed to be functionally equivalent to their corresponding modules within original RTL-based design 204, while any discrepancies between output vectors 260 and reference output vectors 220 can be attributable to the tar2.mod 226.

Figure 9D:
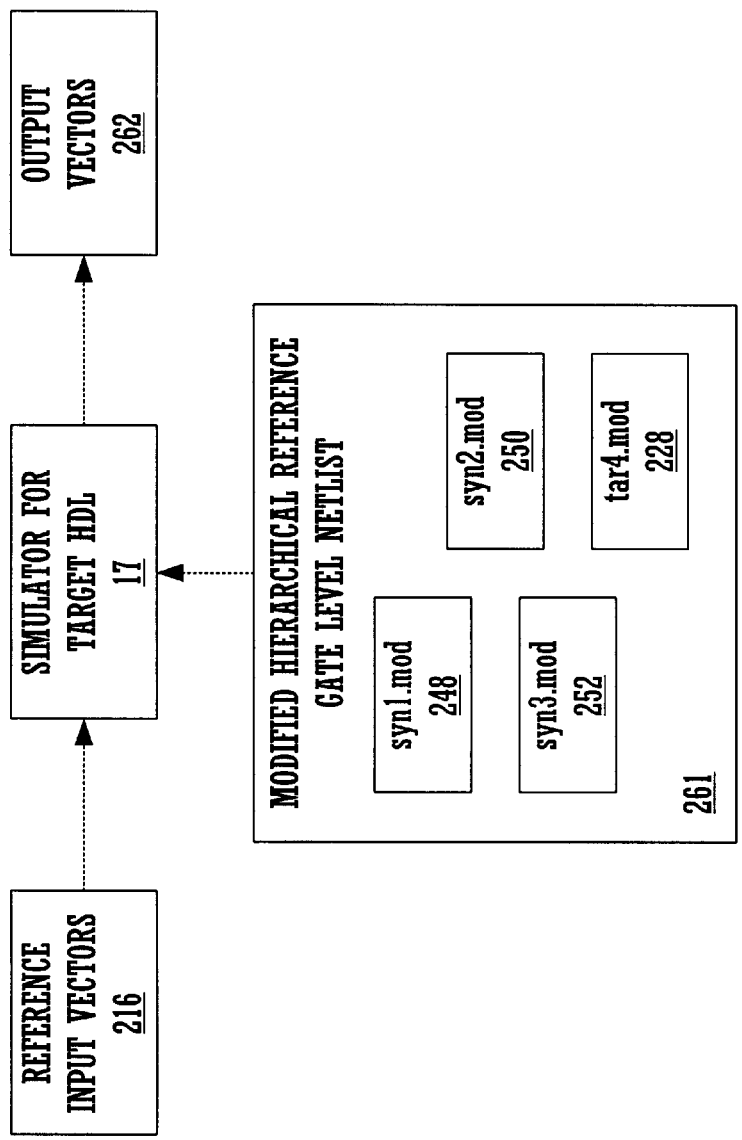
FIG. 9D is a block diagram showing a verification environment where a fourth synthesized module is replaced with a fourth target module in accordance with a presently preferred embodiment of the present invention.

FIG. 9D is a block diagram showing a verification environment where a fourth synthesized module is replaced with a fourth target module in accordance with a presently preferred embodiment of the present invention.

Last, referring to FIG. 9D, verifying tar4.mod 228 includes replacing syn4.mod 254, and keeping the other synthesized module in place, such as syn1.mod 248, syn2.mod 250, and syn3.mod 252. Upon replacement, mixed RTL/gate level simulation is performed on modified hierarchical reference gate level netlist 261. This results in a verification environment where the synthesis modules remaining can be assumed to be functionally equivalent to their corresponding modules within original RTL-based design 204, while any discrepancies between output vectors 262 and reference output vectors 220 can be attributable to tar4.mod 228.

This bottom-up approach of replacing only one module at a time within netlist 242 and using mix RTL/gate level simulation provides the advantages of simplified testing and concurrency. Testing is simplified because if output vectors do not match reference output vectors 220, the problem is traceable to the RTL-based module that was swapped with a synthesized module in netlist 242. The remaining synthesized modules are assumed valid and accurate because they were directly synthesized from original RTL-based circuit design 204.

Concurrency is also achieved because each target module can be independently swapped with its corresponding module within the reference hierarchical gate level netlist, enabling parallel testing of each target module as ear target module completes translator. Hence, target modules that are translated first ca be integrated with the reference hierarchical gate-level netlist without waiting for translation of the other target modules to complete.

Those of ordinary skill in the art will readily recognize that parallel verification testing may be provided by using multiple instances of computer system 50 to perform the acts described.

Figure 10:
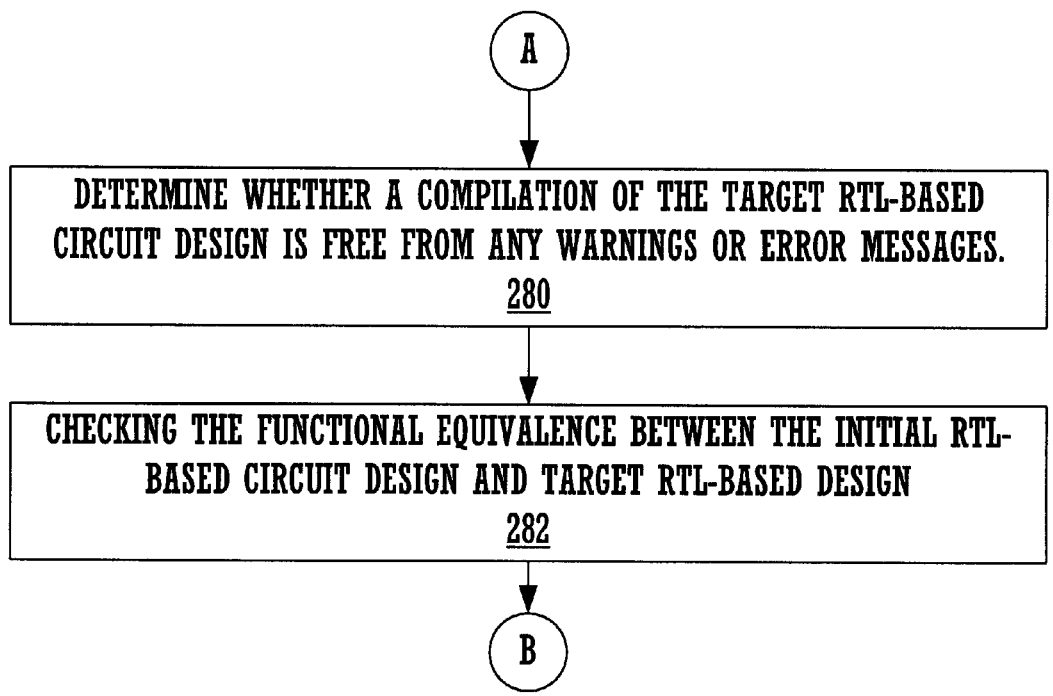
FIG. 10 is a process flow showing a method for translating a first RTL-based circuit design to a second RTL-based circuit design in accordance with a second aspect of the present invention.

FIG. 10 is a process flow showing a method for translating a first RTL-based circuit design to a second RTL-based circuit design in accordance with a second aspect of the present invention.

Those of ordinary skill in the art will readily recognize that some code translation tools do not generate translations which when compiled are warning free or error free. The method of translation disclosed above may further include the process described by reference numbers 280 and 282.

At reference number 280, through node A of FIG. 5, the target modules comprising the target RTL-based circuit design are compiled, checked for warning or error messages, and modified if warning or error messages exist. For example, target modules 222, 224, 226 and 228 are each individually compiled, i.e., target RTL-based circuit design 230 is compiled at the module level. If any of target modules 222, 224, 226 and 228 contain warning or error messages, the offending module(s) is modified appropriately to ensure the module(s) is warning or error message free when compiled. Modification of each offending target module, if any, may be performed in parallel to obtain an efficiency advantage. Modification may be performed manually but the second aspect of the present invention is not intended to be limited in this manner in any way.

At reference number 282, the functional equivalence of each target module is then checked against their corresponding original modules using an equivalence tool, such as equivalence checker 54. Preferably, each target module is functionally compared with its corresponding original module at the binary level. For example, HDL compiler 58 may be used to compile target module 222 and original module 208 at the binary level. This results in binary descriptions of target module 208 and original module 208, which are functional compared for equivalence. If functional equivalence is not found, target module 222 is modified until functional equivalence is obtained. The process flow may then proceed to reference number 108 through node B as shown in FIG. 5.

Figure 11:
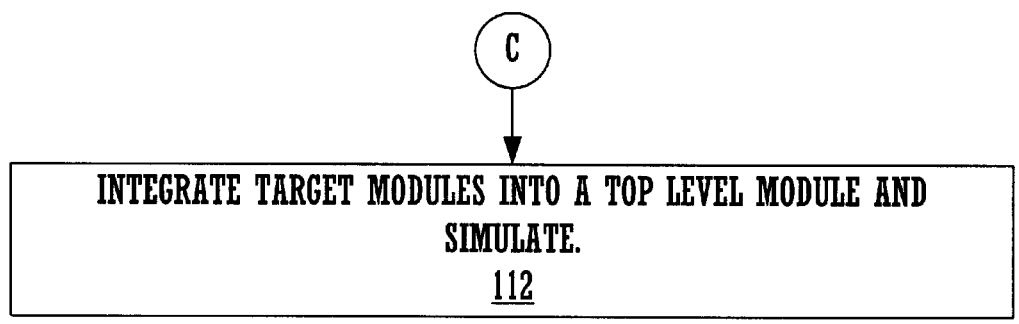
FIG. 11 is a process flow showing a method for translating a first RTL-based circuit design to a second RTL-based circuit design in accordance with a third aspect of the present invention.

FIG. 11 is a process flow showing a method for translating a first RTL-based circuit design to a second RTL-based circuit design in accordance with a third aspect of the present invention.

Those of ordinary skill in the art will readily recognize that added confidence as to the accuracy of the translation between an initial RTL-based circuit design and a target RTL-based circuit design by performing all additional verification act as disclosed at reference number 112.

At reference number 112, through node C of FIG. 5, all of the verified target modules are integrated into a top-level module. The top-level module is then simulated using reference-input vectors 216. The output vectors generated are sampled and compared with reference output vectors 220.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

We claim:

1. A method of translating a HDL-based ASIC design from a first RTL format to a second RTL format, said first RTL format describing said HDL-based ASIC design through a first set of modules arranged in a hierarchical manner, said method comprising the steps of:

creating a reference gate-level netlist by synthesizing the first RTL format;

creating a second set of modules by translating the RTL format of the first set of modules to the second RTL format module by module; and creating a combined RTL and gate-level design by integrating one module at a time from said second set of modules within said reference gate-level netlist.

2. The method of claim 1, further including a step of testing said module within said second set of modules by performing a mixed RTL/gate level simulation on said combined RTL and gate-level design.

3. The method of claim 2, wherein said step of testing includes a step of using a library component file describing the functionality of components used by said second set of modules within said combined RTL and gate-level design.

4. The method of claim 2, wherein said step of performing a mixed RTL/gate-level simulation is performed at the top-level hierarchy of said combined RTL and gate-level design.

5. The method of claim 1, further including a step of individually simulating each module with said second set of modules to determine whether said each module is warning free.

6. The method of claim 1, further including the step of verifying the equivalence of a module within said second set of modules with a module within the first set of modules by using a Formal equivalence tool to determine whether said modules are functionally equivalent.

7. The method of claim 6, wherein said determining includes the steps of:

converting the first set of modules from said first RTL format to a binary format;

converting said second set of modules from said second RTL format to a binary format; and comparing each module within said second set of modules in said binary format with each corresponding module with the first set of modules in said binary format.

8. A method of verifying a translation between hardware design languages, comprising:

a) creating a reference gate-level netlist by synthesizing a hardware design language (HDL) design in a first register-transfer level (RTL) format, said HDL design comprising a first set of modules and said reference gate-level netlist comprising a second set of modules;

b) translating a first module in said HDL design from said first RTL format to a second RTL format;

c) replacing a corresponding module in said reference gate-level netlist with said first module to create a mixed RTL/gate level design; and d) performing a simulation on said mixed RTL/gate level design to create sample output vectors that are compared to reference output vectors from a simulation of said reference gate-level netlist.

9. A method according to claim 8, further comprising:

said repeating said b) through said d) for the rest of said first set of modules of said HDL design and said second set of modules of said reference gate-level netlist.

10. A method according to claim 9, further comprising:

integrating all translated modules from said b) into a top-level module; and performing a simulation on said top-level module to create output vectors that are compared to said reference output vectors.

11. A method according to claim 9, wherein said b) further comprises:

checking said translated modules for warning messages and modifying if necessary.

12. A method according to claim 9, wherein said b) is performed in parallel for said first set of modules of said HDL design.

13. A method according to claim 8, wherein said d) is performed at a top-level hierarchy of said mixed RTL/gate level design.

14. A method according to claim 8, wherein said b) further comprises:

verifying equivalence of said first module between said first RTL format and said second RTL format.

* * * * *